United States Patent

Hallman et al.

[11] 4,000,334
[45] Dec. 28, 1976

[54] THERMAL IMAGING INVOLVING IMAGEWISE MELTING TO FORM SPACED APART GLOBULES

[75] Inventors: Robert W. Hallman, Orchard Lake; Stanford R. Ovshinsky, Bloomfield Hills; John P. deNeufville, Birmingham, all of Mich.

[73] Assignee: Energy Conversion Devices, Inc., Troy, Mich.

[22] Filed: Oct. 19, 1973

[21] Appl. No.: 407,944

Related U.S. Application Data

[63] Continuation-in-part of Ser. No. 162,842, July 15, 1971, abandoned.

[52] U.S. Cl. .............................. 427/56; 96/27 E; 96/33; 96/44; 96/48 QP; 250/316; 250/317; 427/43; 427/53
[51] Int. Cl.² ............ B95C 5/00; G03C 5/16; G03C 5/04; G03C 5/24
[58] Field of Search .......... 96/1.5, 27 E, 27 R, 96/33, 48 PQ, 44, 88, 48 R, 36.3; 250/316, 317; 427/53, 56, 43

[56] References Cited

UNITED STATES PATENTS

| | | | |
|---|---|---|---|
| 3,392,020 | 7/1968 | Yutzy et al. | 250/317 |
| 3,451,813 | 6/1969 | Kinney et al. | 96/36.2 |
| 3,476,578 | 11/1969 | Brinckman | 250/317 |
| 3,522,047 | 7/1970 | Kishidg et al. | 250/317 |
| 3,549,733 | 12/1970 | Caddell | 96/35.1 |
| 3,715,210 | 2/1973 | Watkinson et al. | 96/33 |
| 3,716,844 | 2/1973 | Brodsky | 96/88 |
| 3,753,705 | 8/1973 | Goffe | 96/27 R |
| 3,804,620 | 4/1974 | Wells | 96/33 |

FOREIGN PATENTS OR APPLICATIONS 1,286,503   8/1972   United Kingdom ............... 96/36.2

OTHER PUBLICATIONS

Harris et al., "Continuous Wave Laser Recording on Metallic Thin Film", *Image Technology*, vol. 12, No. 13, p. 31, April/May 1970.
*Physical Properties of Kodak Estar Base Films*, Eastman Kodak Co., Rochester, N.Y. 1964.

*Primary Examiner*—Roland E. Martin, Jr.
*Assistant Examiner*—Richard L. Schilling
*Attorney, Agent, or Firm*—Wallenstein, Spangenberg, Hattis & Strampel

[57] ABSTRACT

A dispersion imaging material, such as tellurium, which disperses upon the absorption of energy above a certain threshold is provided in the form of a thin, continuous film, preferably on a substrate. Energy, in the form of a pulse, is applied to the continuous film in a pattern, which includes a plurality of regions, in an amount and for a length of time sufficient to cause dispersion of the dispersion imaging material simultaneously in all those regions which receive the energy. Preferably, the energy is applied through an imaging mask to produce a duplicate of the image. Sensitizing materials advantageously can be employed to form an indigenous mask on the dispersion imaging material. In addition, dispersion promoting materials can be utilized to enhance and accelerate the formation of a stable image. In the preferred embodiment of the method, the dispersion imaging material is carried on a substrate having a low heat conductivity.

13 Claims, 15 Drawing Figures

THERMAL IMAGING INVOLVING IMAGEWISE MELTING TO FORM SPACED APART GLOBULES

This application is a continuation-in-part application of co-pending application Ser. No. 162,842, filed July 15, 1971, entitled "Method For Producing Images", now abandoned.

The present invention relates to a new method of producing images and duplicates of images by the use of a dispersion imaging material.

Most methods presently used for imaging or producing duplicates of images require pre-exposure protection of the imaging material and development and fixing of the material after exposure. Because of the inconvenience introduced by these requirements, much effort has been expended to provide new imaging materials and imaging methods which simplify the handling of the imaging materials. Various materials are now available which do away with at least one or the other of the requirements.

The present invention provides a new imaging system which requires no special precautions to be taken with respect to lighting, no development of the exposed material and no fixing. In other words, simple exposure, for example, through a mask, produces a finished, permanent, stable image by dispersion of a dispersion imaging material.

Recently, various authors reported that lasers can be used for real-time thermal recording on various thin film materials. C. O. Carlson et al, for instance, report in Science, 154, 1550 (1966) the recording of patterns generated by scanning laser beams or substrated, about 500 Angstroms thick, films of lead and tantalum, and on one micron thick coatings of a triphenylmethane dye in a plastic binder, whereby the dye was bleached by the laser energy. Similar work was reported in a paper entitled "Some Considerations in the Design of a Laser Thermal Micro Image Recorder", by C. O. Carlson and H. D. Ives in Session 16, Optics and Electro-optics in Computers, 1968, published in Westcon Technical Papers 1968, pages 1–8 and by A. L. Harris et al in Image Technology, Volume 12, No. 3, page 31 (1970). These authors used thin metallic films of less than 500 Angstroms thickness of, for example, bismuth, cadmium, gold, cobalt and zirconium. Laser energy of high intensity (of the order of $10^6$ watts/cm$^2$), focused to a few microns diameter, was used for scanning or "writing" and no technique for duplicating existing images, as, for example, through a mask, or projecting images having a plurality of imaging regions in parallel, are described therein.

In this same connection, Belgiam Pat. No. 737,812, granted Feb. 23, 1970, and corresponding Argentine Pat. No. 172,602 and British Pat. No. 1,286,503, disclose a method of producing images by flash exposure which involves applying particles of a radiation-absorbing material such as selenium to a substrate, and then exposing the particles to an optical image with energy to effect fusion, or evaporation, of the radiation-absorbing material. The method disclosed in those patents has a number of disadvantages, chief among which are difficulties in forming a layer of particles of required size on a substrate, and the low optical density, and, concomitantly, the poor contrast provided by the particle layer.

The present invention provides a new imaging method which comprises providing, preferably on a substrate, a thin, continuous film of a dispersion imaging material, as will be described hereinafter in detail, which film of material, upon application of energy in an amount which increases the absorbed energy of the material above a certain threshold value, disperses. Energy is applied to the layer of dispersion imaging material in a pattern, wherein the pattern of energy includes at least a plurality of regions. The amount of the energy must be sufficient to increase the absorbed energy in the corresponding regions of the imaging material above the threshold value. In a plurality of other regions the amounts of energy supplied is insufficient to increase the absorbed energy above the threshold value, thereby causing dispersion of the imaging material only in those areas which receive the higher amount of energy.

The energy is preferably radiant energy including electron beam and particle energy which may be projected onto said dispersion imaging material simultaneously in the plurality of discrete regions which are to receive the higher amount of energy. The image, comprising a plurality of discrete regions, may be provided by means of a plurality of energy sources such as a beam of energy split by mirrors, or the like, directed onto the dispersion imaging material to form the image thereon, or it may be an image projected, for example, through a lens. This includes also the use of energy other than radiant energy such as electrical energy. For copying existing images, the energy may be applied through an imaging mask.

Of course, if an imaging mask is used, the image on the mask may be produced in its entirety by a single exposure, or it may be produced by successive exposure of portions of the image. The energy is preferably applied in the form of short pulses.

The most preferred embodiment of the method of the invention provides a new, full format imaging method which comprises providing, preferably on a substrate, a thin, continuous film of a dispersion imaging material, providing an energy source which is capable of emitting radiant energy of an intensity sufficient to cause dispersion of said dispersion imaging material, and providing between the energy source and the film of dispersion imaging material at least one masking means bearing an image of at least one area which has a high transmissiveness for said radiant energy and at least one other area which has lesser transmissiveness for said radiant energy. The film of dispersion imaging material is thereafter subjected to a pulse of the radiant energy such that the radiant energy passes through the transmissive areas of said masking means and onto said film of dispersion imaging material to cause dispersion of the dispersion imaging material in those areas which are receiving the higher amount of radiant energy to form a duplicate of the image represented on the mask.

For best results, the intensity and pulse width of the radiant energy are adjusted such that the dispersion imaging material disperses in those areas which correspond to the portions of the mask having the higher transmissiveness, and such that those areas of the dispersion imaging material which correspond to the portions of the mask having the lesser transmissiveness for the energy remain substantially in their original condition.

Excellent results have been obtained in the method of the invention with materials, for example, which are electrical semiconductors and have low heat conductivity. Exemplary of such materials are tellurium, and tellurium-containing compositions. These materials may also be used with great benefit to produce images by laser scanning or by the use of other sources of radiant energy and imaging means. Preferred materials are the amorphous semiconductors having low to medium melting points, particularly the chalcogenide elements other than oxygen and compositions containing them. These include the materials which are known as memory materials, and which are characterized by their ability to undergo physical change from one condition to another under the effects of energy. These materials may be used in their amorphous or in their crystalline form. Many of these materials contain short or long chain polymers with little chemical crosslinking so that the molecules can flow, or diffuse, exhibiting elastomeric properties under the effects of energy. Even those materials of this group which contain crosslinks between molecules or atoms can be readily converted into an easily flowable form by energy of moderate levels because the bonds may be readily broken under the effects of the applied energy.

The just mentioned changes can be produced by breaking bonds between molecules or atoms, or reducing Van der Waals forces or other forces between molecules or atoms. The energy can produce electron hole pairs in these semiconductors and these carriers in turn can result in chain scission or reduction of other forces which permits mobility allowing movement or diffusion of atoms or molecules. Nucleation and other phenomena, as explained for instance, in co-pending application Ser. No. 143,781, filed on May 17, 1971, By Robert W. Hallman and Stanford R. Ovshinsky and entitled "Method for Producing Images and Product", may also be useful in explaining the effects observed in the method of the present invention. This increased mobility can initiate the further movement of semiconductor material to cause dispersion in accordance with the present invention. This makes the memory materials excellent dispersion imaging materials.

Suitable semiconductor materials and memory materials are disclosed, for instance, in U.S. Pat. No. 3,271,591 issued on Sept. 6, 1966, to S. R. Ovshinsky and in U.S. Pat. No. 3,530,441 issued on Sept. 22, 1970, to S. R. Ovshinsky, and will be described in greater detail hereinafter.

The method of the invention is based, in the main, on the concept that those areas of the continuous film of dispersion imaging material which are subjected to a sufficient amount of energy disperse while those areas which receive lesser or no energy remain undispersed. The dispersion imaging material may be provided as a free layer. However, most advantageously it is provided on a substrate in the form of a continuous thin film. In those areas of the film which receive sufficient energy, the dispersion imaging material melts or softens, or otherwise changes its state, so that dispersion occurs. By providing the dispersion imaging material in the form of a continuous film, far greater optical density, and, therefore, contrast, is achieved by the method of this invention than is provided by the particle layer of the method of the aforementioned Belgium, and related patents. In fact, assuming the particle layer and the continuous film to be of essentially the same thickness, the optical density attained with a continuous film employed in the method of this invention will be of the order of 20 times greater than the optical density of a particle layer used in the method of said patents.

The term "dispersion" as used herein means that a continuous thin film of solid material becomes discontinuous when the internal energy of the material is increased above a critical threshold value as the result of absorption of energy. When this value is reached, areas will form in the film which are more transmissive to, or less reflective of, for instance, light, than other areas of the film, such that a detectable image consisting of a plurality of transmissive or reflective areas, and areas of lesser transmissiveness or reflectance is formed.

Dispersion may involve simply cracking up of the film to form small discrete islands or discrete particles. Or the film may thin out in areas to become transmissive to, for instance, light or other energy forms used for detection of the image while it remains non-transmissive or of lesser transmissiveness in other areas thus forming a detectable image. Generally, it is desirable that, in the case of an opaque material, the thinned out sections have thinned out enough to permit at least 20% of the light falling onto them to be transmitted to the other side. In the case of light transmissive or partially transmissive materials, the dispersion imaging material should thin out, for dispersion, to at least 10% of its original thickness and preferably to less of its original thickness to produce distinct areas of greater transmissiveness or of other physically distinctive characteristics such as surface reflection.

In the most preferred form of the method of the invention, the film of dispersion imaging material, where it receives sufficient energy, melts or becomes soft, or otherwise undergoes a change in state in which the surface tension of the material acts to cause the continuous film to change toward the formation of very small globules or similar small structures of a size so small that they do not interfere with the normal light transmission or reflection of the substrate. Clarity and transmissiveness of the image is of course influenced by the choice of the substrate. The formation of the globules or similar structures is predicated on the wettability of the substrate material by the molten or softened dispersion imaging material, or by any other materials being present at the interphase between these materials. A wider choice of combinations of dispersion imaging materials and substrates is available and still better results are possible by the provision of an intermediary layer of a material which substantially reduces the wettability of the substrate by the molten dispersion imaging material.

As stated, the above mentioned semiconductor materials, especially tellurium and telluium containing compositions, and the other chalcogenides and the various compositions containing these elements in admixture or in chemical combination are, in accordance with the invention, particularly useful as dispersion imaging materials in a method where the energy is supplied by a laser. This includes also scanning or writing by laser beams, modulated or unmodulated, and also the use of particle energy, or of any other energy including electron beam energy which is capable of causing dispersion.

It has also been found, in accordance with the invention, that the dispersibility of the dispersion imaging material can be facilitated and increased by the provision of a layer or film of a suitable material on top of the dispersion imaging material. This embodiment of the method of the invention permits the use of still lower levels and amounts of energy, and may reduce the necessary pulse width with the benefits which will be described hereinafter in the detailed description of the invention. The amount of energy needed may also be reduced by the use of a substrate which has a low heat conductivity.

Instead of using a separate mask for the imaging in accordance with the invention, an indigenous mask advantageously may be provided directly on the film of the dispersion imaging material, or on any layer or layers which may be present on top of the film of the dispersion imaging material or, if desired, also on the reverse side of the substrate, if the substrate is energy transmissive per se.

Other objects, advantages and features of the invention will become apparent to those skilled in the art from the following description and claims of the invention and from the attached drawings in which:

Figure 1:
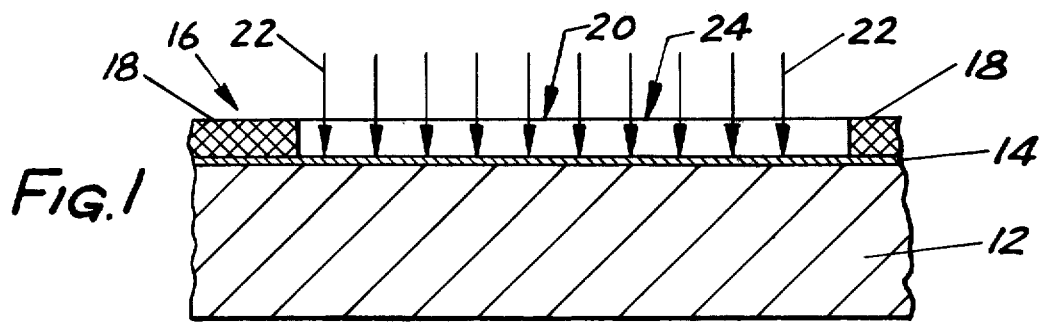
FIG. 1 is a sectional view of a sheet of substrate with a film of dispersion imaging material disposed thereon and a mask provided thereupon, showing the selective exposure of the structure to radiant energy.
Figure 2:
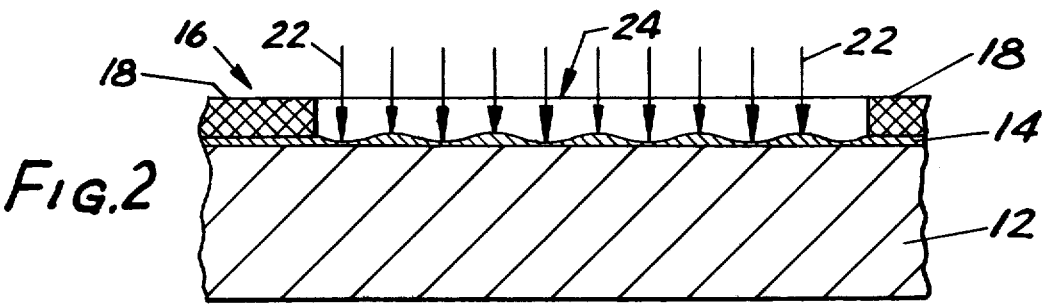
FIGS. 2 to 5 represent the structure of FIG. 1, showing various stages of the dispersion of the dispersion imaging material in the exposed area.

Referring to the drawings, the structure shown in FIG. 1 comprises a substrate 12, such as cellulose acetate or Mylar, on which is disposed a thin, continuous layer or film 14 of an opaque dispersion imaging material, such as elemental tellurium. Onto the film 14 of dispersion imaging material has been placed an imaging mask 16, such as an imaged, chromium mask, comprising opaque protions 18 and transparent portion 20. Arrows 22 represent radiant energy emitted by a suitable source such as a Xenon Flash Gun and falling through transparent portion 20 of the mask onto the film 14 of dispersion imaging material.

As will be seen, the method of the invention consists in subjecting a layer or film of dispersion imaging material to a brief energy pulse, striking the film in an imaged pattern, resulting in local melting or softening of the dispersion imaging material in the areas receiving the higher energy and intensity. Thereby, light transmission is obtained by virtue of discontinuous islanding prior to the spontaneous freeze in the dispersed areas. The imaged pattern of energy used in the method of the invention may be achieved, as stated, by providing an imaging mask in the path of the energy striking the layer of dispersion imaging material. The imaged pattern of energy may also be achieved by projecting laser energy, for example, or particle radiation, in a suitable pattern comprising simultaneously a plurality of energy regions. The projected energy may be continuous or pulsed, and may be applied by scanning or similar methods, if desired, with suitable controls such as of a computer to form any desired image.

Figure 3:
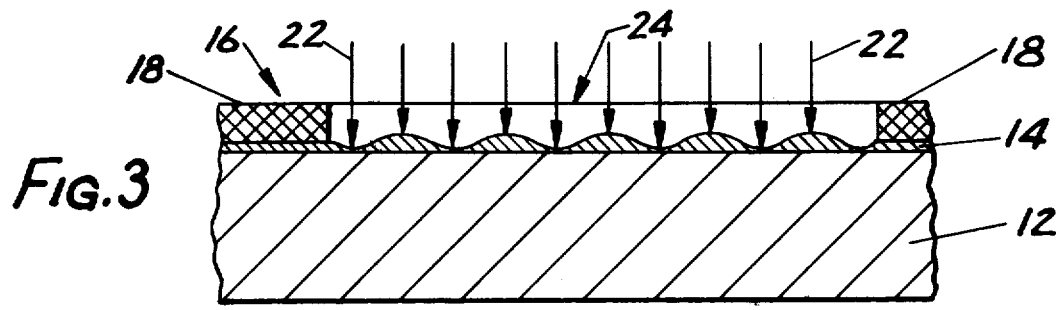
Figure 4:
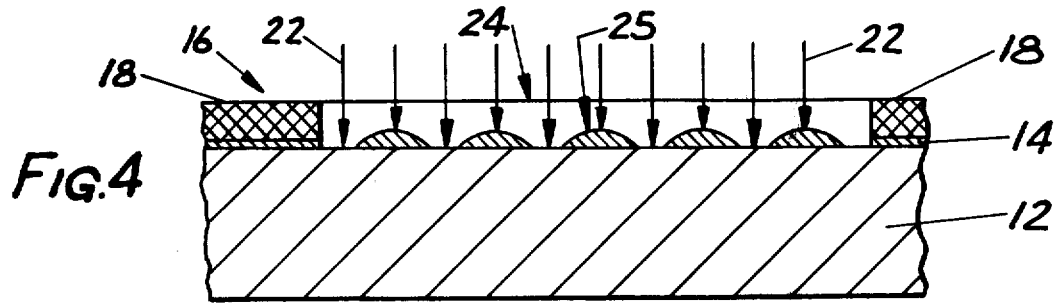
Figure 5:
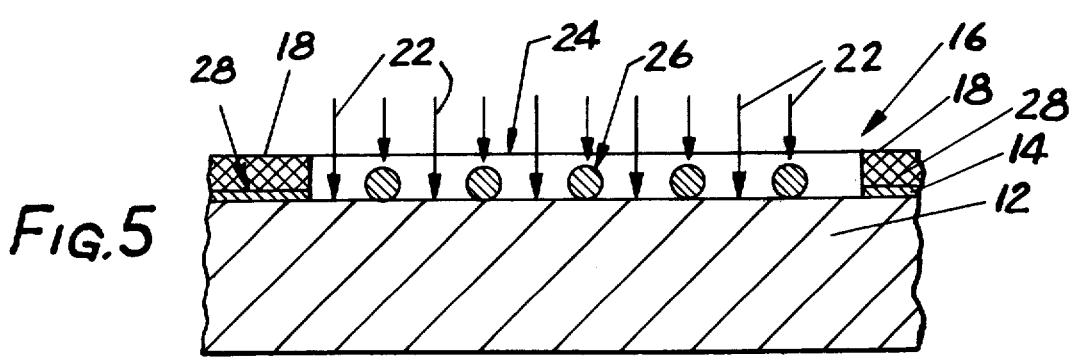

In the embodiment of the method of the invention illustrated in FIGS. 1–5, the area 24 of the layer 14 of dispersion imaging material undergoes, while it is subjected to the flash or pulse from the source of radiant energy, a series of physical changes until, at the termination of the exposure to radiant energy, the material in area 24 has assumed the structure represented in FIG. 5. In some cases, it may be sufficient, if the material has assumed at the termination of the exposure an intermediate structure, such as that represented, for instance, by FIG. 3 or by FIG. 4.

Depending on the dispersion imaging material used, and depending on the nature of the substrate and the type and character of the energy employed in any individual instance, the mechanism by which the dispersion occurs may vary between various alternatives. The layer or film of dispersion imaging material may fracture and dispersion may be initiated at the fracture lines. The dispersion imaging material becomes soft, starting to thin out at various points and becoming thicker or forming humps at various other points. FIGS. 2 to 5 represent a section along a line at which the dispersion imaging material ultimately breaks up into the separate spheres or globules shown in FIG. 5. The thinning out and the formation of humps shown in FIG. 2 continues to form a configuration such as shown in FIG. 3. Thereafter, the material breaks up to form separate humps 25 as shown in FIG. 4. Finally, the material, making up each individual hump, flows together under the effect of the surface tension to form small globules 25 as shown in FIG. 5. These globules adhere to the substrate, and when the effect of the radiant energy ceases they cool and solidify. The globules 26 can be of very small size, for example, having a diameter of about 1 micron or less and are spaced from each other by a considerable distance.

Depending on the nature of the substrate, the surface of the substrate may have temporarily softened and the globules may be sunk, at least in part, into the top strata of the substrate.

Light can pass through the free space surrounding the individual globules. If the substrate 12 is transparent, as is the case with cellulose acetate or Mylar, light will pass through area 24 characterized by the globules 26 in FIG. 5 and area 24 appears transparent, while 28 consisting of the unchanged, undispersed continuous film 14 of the dispersion imaging material do not transmit light if said dispersion imaging material is opaque. In this manner a high contrast image is formed. The globules 26 are so small that they are invisible if inspected by the naked eye. They are also not visible at reasonable enlargements such as are normally used to rear out the image as in the case of reading microfilm or microfiche. In fact with the preferred thickness of the layer or film 14 of dispersion imaging material and with the preferred operating conditions of the method of the invention, the globules 26 are so small and spaced so far apart, that the exposed area 24 of the film 14 can be considered to be highly transparent even at considerable magnification. At magnifications of up to 15 to 20 times, the globules of dispersion imaging material do no become visible as individual entities.

Similar considerations apply if the substrate 12 is a non-transparent, light reflecting material such as heavily filled glossy paper. In this case the exposed area 24 of the paper surface reflects light and appears white without noticeable interference by the globules 26, while the opaque non-irradiated areas 28, if they are relatively non-reflective, appear dark and highly contrasted from the light colored reflective substrate.

The mechanism illustrated in FIGS. 1 to 5 represents only one possibility for the mechanism by which the dispersion of the dispersion imaging material takes place. Other possibilities include the cracking up of the layer or film 14 of the dispersion imaging material into small fractured pieces which thereafter may soften or melt to form the individual globules or which may otherwise change their shape to provide the transmissive areas. The mechanism of dispersion varies also to a degree with the nature and composition of the dispersion imaging material used in each instance. Any other mechanism of dispersion is possible and this invention is not limited to any one theory of dispersion.

Figure 6:
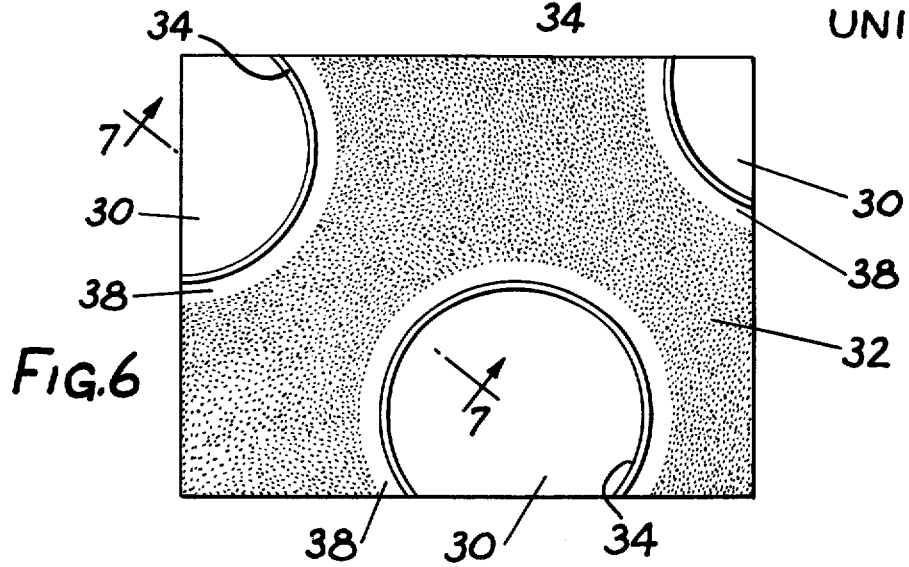
FIG. 6 is a representation of a photomicrograph, showing a 400X enlargement of several dots of a halftone line screen image surrounded by the very small dispersed particles of the dispersion imaging material.
Figure 7:
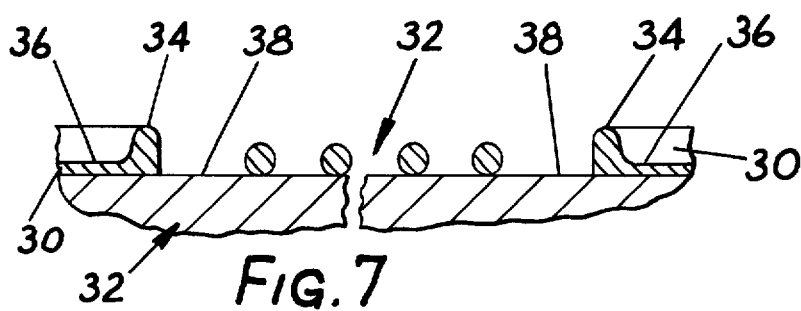
FIG. 7 is a sectional view of the dots of FIG. 6 taken along line 7—7.

FIG. 6 is a representation of a microphotograph of a portion of a halftone line screen image produced in accordance with the method of the invention and showing parts of three of the dots 30 forming the image.

The image represented in FIG. 6 was obtained as follows: A structure was prepared which comprised on a thin film of Mylar a one micron thick film of tellurium adhering to the Mylar substrate. An imaging mask was prepared by copying a photograph through a 133 line screen onto a conventional silver halide emulsion from which a metal master was made. The metal master, with the metal side down, was placed onto and in contact with the tellurium layer and a Xenon Electronic Flash Gun of 80 Joules output was held close to the metal mask. The lamp was flashed to provide a pulse of one millisecond.

The stippling in area 32 is representative of the actual size distribution and density of the globules 26 shown in FIG. 5, in relation to the dots generated by the line screen. The representation in FIG. 6 shows that the new method of the invention is capable of reproducing halftone images in excellent manner. In the actual photomicrograph, dots 30 consisting of undispersed tellurium are black, while the areas 32 in between exhibit a slightly gray appearance, providing for high contrast. FIG. 6 shows also that the method of the invention produces images of very high contrast, resolution, definition and sharpness.

In some cases, the apparent or actual sharpness is further increased by the presence of a ridge 34 all around the edges of the unchanged film 36 of dispersion imaging material. These ridges 34 are apparently formed by molten imaging material which is drawn onto, or flows onto, the edge portions from the vicinity. In this manner, a ring-like area 38, which is relatively free from globules, is formed around each of the dots 30. These areas 38 therefore appear in the photomicrograph as absolutely white, bringing a further increase of apparent or actual contrast, definition and resolution. Depending on the nature of the dispersion imaging material, these ridges 34 may be more or less pronounced and sometimes they may be completely absent.

The dispersion imaging material has been shown hereinbefore in the dispersed areas as perfect spheres. Depending on the nature and composition of the dispersion imaging material, on the conditions applied in the method of operation, and the nature of the substrate, the particles of dispersed material may be of any other form such as flattened spheres, "lenses", blister-like particles, irregularly shaped globules, or other forms such as flakes. To be useful in the method of the invention, the particles, are spaced from each other sufficiently to produce a readily detectable difference in transmission or reflection in the dispersed areas as against the non-dispersed areas which are in their original state. As stated hereinbefore, the transmissive areas may also comprise thinned out dispersion imaging material instead of areas which are completely free from that material.

A dispersion imaging system of the kind described hereinbefore may be limited in its usefulness if the imaging mask used therein is damaged by the radiant energy employed for bringing about the dispersion of the dispersion imaging material. If, for example, a plurality of copies is to be produced from a single master, it is not acceptable that the master is affected in any way by the individual exposures. Since the commonly used silver halide masters are easily damaged at high power density intensities of radiant energy, it is preferable that the dispersion of the dispersion imaging material is effected at an intensity level and at a pulse width which in themselves do not damage the silver halide master. In fact it is very desirable that a good safety margin exists so that numbers of copies can be taken from a single silver halide master by the method of the invention without any damage to the master.

The mechanism of damaging a silver halide gelatin emulsion appears to involve a threshold type reaction. If the individual exposures are held in their intensity and time below the threshold of damage, the individual exposures are not additive. Accordingly a certain master may be used for a large number of exposures below the damage threshold energy, and even though the sum of the amounts of energy applied in the successive exposures greatly exceeds the threshold, no damage is done to the silver halide master.

The dispersion imaging system of the present invention enables the energy of the individual exposure to be held below the damage threshold of the master, yet above the threshold for the dispersion of the dispersion imaging material as is evidenced by the curves of FIG. 8 of the drawings. These curves show that for a wide range of intensities and coordinated pulse widths of the energy the dispersion of the dispersion imaging material of the invention can be effected with considerably lower amounts of energy than those amounts which would damage a silver halide master imaging mask. A silver halide gelatin emulsion imaging mask can be exposed for very short times, without harm being done, to intensities which at longer times would cause complete destruction of the silver halide gelatin mask. Therefore, it is important for a good dispersion duplicating system that the intensity level of the radiant energy and the time of exposure be held below the corresponding values which would harm or damage the silver halide gelatin mask. On the other hand, it is desirable that the dispersion imaging material disperses at these same low energy levels. These requirements are excellently met in the dispersion imaging and duplicating system of the present invention, as will be set out hereinafter.

Figure 8:
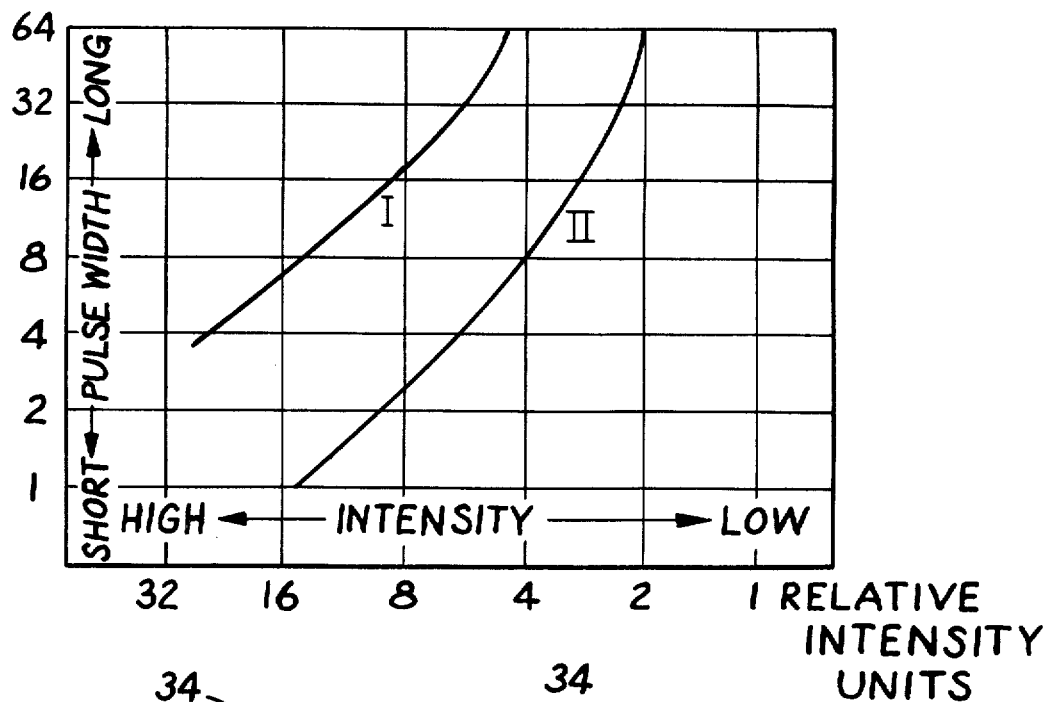
FIG. 8 is a graphic representation comparing the amount of energy which causes damage in a silver halide emulsion mask and the amount of energy which effects dispersion of a tellurium dispersion imaging material on a cellulose acetate substrate.

In the diagram of FIG. 8, pulse width in microseconds is plotted against intensity of the radiant energy in arbitrary units. Curve I was obtained by plotting the pulse widths in microseconds at varying intensities of a laser beam at which the first noticeable damage could be observed on a developed, fixed and dried silver halide emulsion master. The master was represented by a negative microrecord of transparent letters on a black background contained on an cellulose acetate substrate. As can be seen from Curve I, with decreasing intensity the master could be subjected to considerably longer exposure times before the first signs of damage could be observed. In a similar manner, a film of tellurium of 0.1 micron thickness deposited on a 7 mils thick film of cellulose acetate was subjected to pulses of the same laser at the various arbitrary intensity levels used for the exposure of the silver halide master in Curve I. The data obtained by observing complete dispersion at the various pulse widths and intensities of the laser are plotted to result in Curve II, the plotted data representing the minimum intensities and pulse widths at which complete dispersion could be obtained.

It can be readily seen from the diagram in FIG. 8 that in the regions of energy shown, the tellurium dispersion imaging material is completely dispersed at an intensity-pulse width combination which is far below that at which the silver halide master is damaged. For instance, at the intensity 16, the dispersion of the imaging layer is completed at a pulse width of about 1 microsecond. At the same intensity of 16, the silver halide mask shows the first signs of damage only if the pulse width is increased to 8 microseconds. In other words, imaging can be successfully effected through the silver halide master at the intensity 16 with a pulse width of 1 microsecond with absolutely no damage to the silver halide master. A similarly large gap or differential between the first observable damage to the silver halide master and the completion of the dispersion in the imaging layer is present at the lower intensity levels covered by the curves. In this manner a wide range of combinations of intensity levels and pulse widths is available with the dispersion imaging materials of the invention for producing copies even from relatively sensitive masters.

It can be seen from the curves in FIG. 8, that at constant pulse width, the intensity ratio of energy causing damage to the silver halide gelatin emulsion and the intensity causing complete dispersion of the dispersion imaging material increases, as the pulse width decreases.

Principally, the method of the invention is operative with any material which has the capacity, upon application of energy, of dispersing by forming small globules, or other small particles or structures, on a given substrate. The dispersion imaging materials include metals as well as electrical semiconductors and electric non-conductors such as various organic compounds. Most preferred are those dispersion imaging materials which are found among the class of materials designated generally as electrical semiconductors, i.e. materials having an electrical conductivity of from $10^{-13}$ to $10^3$ ohm$^{-1}$cm$^{-1}$. It has been found that these materials combine with a moderate electrical conductivity also a relatively low or intermediate heat conductivity which makes them preferred dispersion imaging materials of the present invention as will be set out hereinafter. These semiconductor materials are usually also more brittle than metals. This brittleness can in some cases favor dispersion. Most preferred among these semiconductor materials are tellurium and tellurium containing compositions, and the memory materials disclosed in the aforementioned patents. The memory materials may be present in the continuous film in amorphous or in crystalline form, as may be desired.

The dispersion imaging materials useful in the practice of the invention are characterized in that they have a relatively low melting or softening point which is low enough to permit temporary melting or at least softening of the material under the effect of the available source of radiant energy. In this connection, it is well to mention that the energy needed for temporary melting or softening and dispersion of the selected dispersion imaging material should not be greater than can be accommodated by the substrate whereon the dispersion imaging material is contained. Substrates of the low heat conductivity, therefore, are preferred.

The dispersion imaging materials are further characterized in that they have, at or above their melting or softening point, and at the imaging temperature reached in the imaging method, a viscosity which is low enough to permit the flowing together thereof into small droplets or similar structures, or at least the thinning out thereof sufficiently to form selected transmissive or reflective areas. At the same time, the imaging material should preferably also have a relatively high surface tension when it is in the molten or softened state to promote droplet or globule formation. In addition to the foregoing, the dispersion imaging material should also have a low wettability for the particular substrate on which it is used. If the wettability of the dispersion imaging material for its substrate is too great, insufficient dispersion and poor images may result. Thus, a particular material may be an excellent dispersion imaging material on one substrate, while being a comparatively poor one on another substrate. This substrate dependency is an important consideration in the selection of a suitable dispersion imaging material for a given imaging system.

Another desirable property of the dispersion imaging materials is that they have a relatively low thermal conductivity. The benefit of the low thermal conductivity of the dispersion imaging material resides in the fact that it results in less lateral heat conduction so that lateral bleed is minimized at the boundary between dispersed and non-dispersed area. Images produced with low to medium thermal conductivity dispersion imaging materials are therefore sharper and provide higher resolution. The low thermal conductivity results in lesser heat loss to the substrate so that less energy is needed for dispersion.

The dispersion imaging materials are further characterized in that, in the form of a thin, continuous, undispersed film, they are highly opaque, and have, in the case of reflection viewing, a low reflectivity. In those instances where a particular dispersion imaging material does not have the required high opacity, or low reflectivity, respectively, in its deposited film state, as may be the case in some of the otherwise suitable organic and inorganic imaging materials, opacity, or low reflectivity, may be produced by adding organic dyes or very finely particulate pigments such as carbon black and the like, to the imaging material.

In the production of images by the method of this invention, it is not important whether or not some of the dispersion imaging material vaporizes under the conditions of dispersion. However, if an imaging mask is placed onto or close to the film of dispersion imaging material, it is preferred that the dispersion imaging material does not vaporize to any appreciable extent while the dispersion proceeds. In this manner, the mask does not become contaminated upon repeated use. Generally, the above mentioned semiconductor material, and especially tellurium, and tellurium containing compositions, have, at dispersion temperature a satisfactory low vapor pressure so that these materials are especially suitable for use with an imaging mask.

If the foregoing considerations are observed in the choice of a dispersion imaging material for a given system and substrate, generally excellent images can be obtained at relatively low energy levels of radiant energy. In fact, the images produced in this manner have as high a resolution and as good a definition as can be produced by other known methods. By the use of a suitable highly opaque dispersion imaging material, the images show high contrast even at minimal thicknesses of the film of dispersion imaging material. Therefore, the method of the invention not only enables the production of images and copies from a master by full format flashing without the need for safe lighting, developing and fixing, but results also in images of superior definition and resolution, making the method of the invention particularly suitable for duplication of microrecords, and the like.

Exemplary of dispersion imaging materials which satisfy the aforementioned desiderata are the chalcogenide elements, excepting oxygen, and the glassy or crystallized compositions containing them. As stated, one of the best dispersion imaging materials is tellurium and various compositions containing tellurium and other chalcogenides such as a composition of (parts being by weight in each instance) 92.5 atomic parts tellurium, 2.5 atomic parts germanium, 2.5 atomic parts silicon and 2.5 atomic parts arsenic; a composition of 95 atomic parts tellurium and 5 atomic parts silicon; a composition of 90 atomic parts tellurium, 5 atomic parts germanium, 3 atomic parts silicon and 2 atomic parts antimony; a composition of 85 atomic parts tellurium, 10 atomic parts germanium and 5 atomic parts bismuth; a composition of 85 atomic parts tellurium, 10 atomic parts germanium, 2.5 atomic parts indium and 2.5 atomic parts gallium; a composition of 85 atomic parts tellurium, 10 atomic parts silicon, 4 atomic parts bismuth and 1 atomic part thallium; a composition of 80 atomic parts tellurium, 14 atomic parts germanium, 2 atomic parts bismuth, 2 atomic parts indium and 2 atomic parts sulfur; a composition of 70 parts tellurium, 10 atomic parts arsenic, 10 atomic parts germanium and 10 atomic parts antimony; a composition of 60 atomic parts tellurium, 20 atomic parts germanium, 10 atomic parts selenium and 10 atomic parts sulfur; a composition of 60 atomic parts tellurium, 20 atomic parts germanium and 20 atomic parts selenium; a composition of 60 atomic parts tellurium, 20 atomic parts arsenic, 10 atomic parts germanium and 10 atomic parts gallium; a composition of 81 atomic parts tellurium, 15 atomic parts germanium, 2 atomic parts sulfur and 2 atomic parts indium; a composition of 90 atomic parts selenium, 8 atomic parts germanium and 2 atomic parts thallium; a composition of 85 atomic parts selenium, 10 atomic parts germanium and 5 atomic parts copper; a composition of 85 atomic parts selenium, 14 atomic parts tellurium and 1 atomic part bromine; a composition of 70 atomic parts selenium, 20 atomic parts germanium and 10 atomic parts bismuth; a composition of 95 atomic parts selenium and 5 atomic parts sulfur; and variations of such compositions. In addition, the dispersion imaging material can comprise metals such as bismuth, antimony, selenium, cadmium, zinc, tin, polonium, indium, and compounds of such metals, specific examples of which are antimony trisulfide, bismuth trisulfide, and the like.

By way of summary, generally speaking, those materials, which have a melting or softening point in the range from about room temperature to about 1000° C or higher, a viscosity at or above the melting or softening point in the range from about $10^{-2}$ poises to about $10^5$ poises, whereby the lower range is generally useful only, if the wettability of the chosen substrate is relatively low, a thermal conductivity of from $$10^{-4} \frac{cal \cdot cm}{cm^2 \cdot s \cdot deg. \, C}$$

to $$10^{-1} \frac{cal \cdot cm}{cm^2 \cdot s \cdot deg. \, C},$$

and a surface tension in the softened or molten state of from 50 to 1000 dyns/cm are excellent dispersion imaging materials. Some of the materials having a surface tension in the upper stated range may require ultrasonic vibration for operativeness. Generally, the materials having in molten form a low to medium surface tension within the stated range are preferred, though the surface tension should be high enough, in relation to the substrate, that the wettability of the substrate by the molten or softened dispersion imaging material is relatively low so that the preferred globules are formed upon dispersion of the material by the radiant energy. Stated in other words, if the surface tension of the dispersion imaging material is low, generally only a narrower selection of suitable substrates is available. If the surface tension of the molten dispersion imaging material has higher values, then usually a larger range of substrates is available.

It is to be noted that no single property is decisive of whether or not a given material makes a good dispersion imaging material in the method of the invention. It is the combination of the above stated properties in consideration of the wettability of the chosen substrate, which permit the best possible selection of the dispersion imaging material for a given system and purpose including also such properties as opacity, reflection, adhesiveness to the substrate and abrasion resistance, in addition to such other factors as a relatively low vapor pressure at the melting or softening temperature or at the temperature reached in the dispersion step. As stated above, tellurium, and tellurium containing compositions, meet all of these requirements in an excellent manner. The generally low thermal conductivity of these materials make it possible to use low intensity radiant energy of short duration for complete dispersion in the irradiated areas, producing a minimum of thermal bleed or fuzziness, and resulting in extremely sharp images of highest resolution and excellent definition. One or the other requirements set out above may not be needed if dispersion is achieved without actual melting of the dispersion imaging material by one of the mechanisms set out hereinbefore. In this case, the choice of materials is still greater.

Some of the preferred dispersion imaging materials useful in the method of the invention are capable of reforming a continuous film or layer upon application of an amount of energy at a level which permits the forces of attraction between the imaging material and the substrate to respread the material. The reversibility of the dispersion makes it possible to erase the image and reuse the structure and to make corrections in an image, as may be desired. Redispersion may, for instance, be achieved by adding an agent which increases wettability to the substrate or which suitably affects the surface tension of the material when the dispersed material is subjected to energy.

As indicated, the dispersion imaging material as deposited in a continuous film may be in amorphous or crystalline form, as may be desired. Likewise, depending on the choice of material, the material in the dispersed phase may be amorphous or crystalline. By proper choice of the form and condition of the undispersed and the dispersed material, the contrast in the image may be further increased and the read-out of the images, for instance, by optical or electrical detection means, may be further facilitated. By proper choice of transmissiveness or reflectance of the substrate and of the undispersed dispersion imaging material, it is possible to produce positive or negative images, as may be desired.

The topography of the image obtained by the method of the invention represents areas of different content of energy between the continuous and the dispersed phase of the dispersion imaging material.

It can be seen from the foregoing, that some care must be employed in selecting the intensity and time or duration of application of the radiant energy for imaging through an imaging mask. Since some of the energy also passes through the opaque areas of the imaging mask, the intensity and time of the energy application must be proportioned such that enough energy passes through the "transparent" or transmissive areas of the imaging mask to cause dispersion in the corresponding areas of the film of dispersion imaging material, but the amount of energy applied must be small enough, so that preferably no dispersion takes place in the areas of the film of dispersion imaging material corresponding to the "opaque" or non-transmissive areas of the imaging mask. In addition, in accordance with the foregoing, the applied energy must also be held below the damage threshold for the master. In this manner, any desired number of high contrast duplicates may be produced from a single master. These precautions are usually not required, if the dispersion is achieved by projection of the energy. However, even in this case, it is desirable to proportion the energy such that not too great an excess of energy over that actually needed for dispersion is applied. This makes the method more economical and permits also a wider choice of substrates, and produces sharper images.

The layer or film of dispersion imaging material may be provided on the substrate by any convenient means, for instance, by thermal evaporation and deposition in vacuum, by sputtering, by application in the form of a solution with subsequent evaporation of the solvent, and so forth.

There is a wide range of substrates available which may be successfully used in the method of the invention. The substrate may be inorganic such as silicate glass, ceramics, metals or mica. Preferred are generally organic substrates which, because of their flexibility, can be employed in rolls to provide continuous lengths of copying material. Organic substrates have also a considerably lower thermal conductivity than most of the inorganic substrate materials. The lower heat conductivity of the organic substrate permits the use of radiant energy of considerably lower intensity and much smaller energy input for successful dispersion of the dispersion imaging material. For this reason, those substrates, which have a thermal conductivity of below about $$1.5 \times 10^{-3} \frac{cal \cdot cm}{cm^2 \cdot s \cdot deg. \ C}$$

at room temperature are preferred.

The effect of the nature of the substrate can be demonstrated by the following example. Using a tellurium film on a Mylar substrate, the tellurium may be readily dispersed by an 80 joule flash gun. Leaving everything equal, but substituting glass for Mylar as the substrate, the flash of the 80 joule flash gun is no longer adequate to attain dispersion of the tellurium on the glass substrate. Window glass has about 5 times the heat conductivity of Mylar. This difference is sufficient to cause the greater differential in the energy requirements. Of course, tellurium or similar semiconductor materials on a glass substrate may be readily dispersed, in accordance with the present invention, by such energy sources as lasers, and the like.

Suitable organic substrates can be found among the polyesters such as Mylar. Other suitable organic substrates are polyamides, cellulose acetate, polystyrene, polyethylene, polypropylene, and many more. Generally all those organic materials can be beneficially used as substrates which can be brought into the form of a thin film and which show good affinity to the selected dipersion imaging material so that the latter can be adhered thereto, and which possess, in addition, a good abrasion resistance after imaging. On the other hand, a selected substrate should have as low a wettability as possible for the molten dispersion imaging material so that the dispersion imaging material is successfully dispersed into the preferred small globules or similar particulate structures upon exposure to the radiant energy. This, and the foregoing discussion indicates that the choice of the substrate depends in part on the selected dispersion imaging material and vice versa, and on the desired effect. Especially satisfactory are such materials as Mylar film and cellulose acetate film, both producing transparencies. Desirable also are low porosity, heavily filled papers of various grades, or other opaque cellulosic products for producing images for reflection viewing.

If a certain sustrate is desired for use with a given dispersion imaging material, but cannot be used, because of too high a wettability, it is possible to provide an intermediate layer on the substrate which reduces the wettability by a given dispersion imaging material so that the dispersion imaging material readily disperses upon application of the radiant energy of the required energy level. This may be achieved, for instance, by coating the substrate, prior to the deposition of the dispersion imaging material, with a material which has a low wettability for the dispersion imaging material. The structure shown in FIG. 9 of the drawing is illustrative of a substrate so treated. As shown, the structure 40 comprises a substrate 42 on which is formed a layer or film 44 of a substantially non-wettable material such as aluminum oxide ($Al_2O_3$). Deposition of the aluminum oxide layer or film 44 on the surface of the substrate 42 can be attained by sputtering or evaporating aluminum, in a reduced atmosphere of oxygen, on the substrate surface. The aluminum combines with the available oxygen to form a thin, continuous layer or film of aluminum oxide on the surface. The thickness of the film is variable. However, the generally optimum objectives of this aspect of the invention are achieved with film thicknesses of the order of about 100 to about 300 Angstroms. Non-wettable films also can be formed from such refractory materials as silicon oxide ($SiO_2$), silicon carbide (SiC), zirconium oxide ($ZrO_2$), and the like. Following deposition of the non-wettable layer or film 44, the continuous film 46 of a dispersion imaging material can then be formed on the layer or film 44. The same kind of treatment of the surface of the substrate may also serve to form smaller particles in the dispersed phase where the particle size would otherwise not be acceptable. By this expedient it is possible to greatly increase the choice of suitable substrates for a given dispersion imaging material. With some substrate dispersion imaging material combinations surfactants may be used for the erasure of the image by respreading of the dispersed material.

As a result of using extremely short pulses of energy, the organic substrates are not affected and not damaged, even though the temperature of the molten dispersion imaging material may temporarily exceed the melting temperature of the plastic. In this respect, it is helpful that the lower thermal conductivity of the organic substrate permits the use of lower power densities, which in turn is less harmful to the plastic or other organic substrate materials.

Any desired source of energy may be used in the method, provided it produces the power density required for dispersion by the preferred short pulses of energy. Preferred for imaging through a mask are the devices known generally as electronic flash guns which are capable of producing short flashes of, for instance 10 microseconds or so to several hundred milliseconds, or more, and producing an energy output which is high enough to cause dispersion of the dispersion imaging material. The energy may be provided in form of light and/or heat, the former being converted into heat by absorption. Other sources and forms of energy such as flash bulbs, infrared lamps, particle beam generators etc. may be used so long as they provide temporarily the heat or other energy needed for melting or softening and dispersion of the dispersion imaging material. A convenient source of energy of sufficient power density is the laser. By the use of a laser in combination, for example, with semiconductor dispersion imaging materials such as tellurium and tellurium containing compositions, it is possible to use smaller, less expensive lasers for forming an image, e.g. by scanning and modulation of the laser beam. For full format flashing through a mask, however, the above mentioned flash guns or similar devices of high light and heat output are preferred, with the beam of radiant energy preferably being kept stationary in relation to the image mask and to the imaging structure containing the continuous film of dispersion imaging material. Other suitable forms of energy which are cpable of dispersing the dispersion imaging material, such as electron beam energy, also may be used.

The pulse width of the energy pulses applied to the dispersion imaging material to cause dispersion is variable, and depends, in the main, on the nature of the dispersion imaging material and on the intensity of the energy. With radiant energy such as from a laser, the pulse width may be as low as one or a few microseconds or lower. With the above mentioned flash guns the pulse width may be typically from about 10 microseconds up to 5 milliseconds or more.

Generally, it is preferred to place the imaging mask onto that side of the substrate which contains the layer of dispersion imaging material so that the dispersion imaging material is subjected directly to the radiant energy. However, it is also possible, in the case of a transparent or translucent or an otherwise energy transmissive substrate, to place the mask on the opposite side so that the radiant energy passes through the substrate first. This mode of operation is desirable, for example, in those instances where appreciable volatilization of the dispersion imaging material occurs. In this manner, deposition of dispersion imaging material on the imaging mask or on the master, respectively, is avoided. However, the preferred dispersion imaging materials of the invention do not appreciably volatilize upon flashing in the indicated manner. With these materials, it is preferred to place the imaging mask directly onto the layer of dispersion imaging material or on any coating contained thereon, because of the greater sharpness and definition obtainable in this way.

The thickness of the continuous film of the dispersion imaging material may vary within wide limits, depending on the nature and physical properties of the dispersion imaging material used in each instance. It has been found that with dispersion imaging materials such as tellurium and tellurium containing compositions, thicknesses of the film in the range of from about 1000 Angstroms to about 50,000 Angstroms, and preferably of the order of about 5000 Angstroms to about 20,000 Angstroms readily provide excellent images. With other dispersion imaging materials, the preferred thickness of the film of dispersion imaging material may be as low as 500 Angstroms or less and up to 100,000 Angstroms or more, depending on the physical properties of the material and the effects desired. If no substrate is used, the film of dispersion imaging material may be considerably thicker. It has been observed that in many cases increase of the film thickness resulted in a decrease of the necessary intensity of the energy source and in fact therefore a lesser amount of energy was required to disperse the thicker films than was required to disperse the thinner films of the same material.

It is apparent from the foregoing that each particular imaging material of the invention requires a certain minimum intensity level and a corresponding time of exposure to bring about dispersion. In this respect, the imaging or dispersion reaction can be considered as a threshold reaction, dispersion being achieved when a dispersion imaging material is subjected to energy above a minimum amount which is characteristic of the specific structure to be imaged. Because of the threshold character of the reaction no safe lighting of the starting material and no fixing of the images is required.

Figure 9:
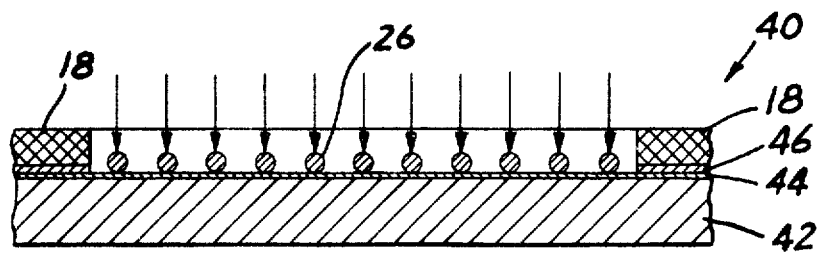
FIGS. 9 through 15 are representations of embodiments of structures useful in the practice of the method.

In accordance with another aspect of the invention, it has been found that the energy required to disperse the material, or reach the threshold, may be lowered if suitable materials are coated onto the dispersion imaging material, for instance, in form of a very thin layer. Such a structure is shown in FIG. 9 of the drawings. As shown, the structure 50 comprises a substrate 52 having a continuous film 54 of a dispersion imaging material thereon. The film 54, in turn, is provided with a thin, continuous layer of film 56 of a dispersion promoting material. The film 56 may comprise any of a variety of materials which by one mechanism or another have an effect on the dispersibility of the dispersion imaging material. Among the materials which have a striking effect in this respect, may be mentioned gum arabic. The gum arabic may be coated onto the layer of dispersion imaging material in the form of a dilute aqueous solution, for instance, by brushing it on, rolling it on, dipping or other suitable manner followed by drying. The layer of gum arabic deposited onto the layer of dispersion imaging material need be only very thin, for instance of a thickness of from about 1,000 to 100,000 Angstroms to exert its full effect. Such a layer of gum arabic lowers the energy required for dispersion considerably. Further in this same connection, it has been found that the effect of such coatings may be increased if the layer or film 56 consists of a combination of two or more different materials. For instance, the addition of silver nitrate to the aqueous gum arabic solution further lowers the energy required for dispersion.

The utilization of a dispersion-promoting layer or film has the added effect of reducing the possibility of damage to an imaging mask or master by effectively reducing the energy needed for the dispersion in relation to the energy at which the imaging master would be harmed. In this manner, the choice of dispersion imaging materials suitable for use with a given imaging mask of a given damage threshold is greatly increased. Another possibility for avoiding harm to the imaging mask in combination with a given dispersion imaging material is the use of a more stable master, such as silver halide gelatin emulsion on glass. The increased thermal conductivity of glass over that of, for instance Mylar or cellulose acetate greatly increases the heat stability of an otherwise identical silver halide gelatin emulsion.

The mechanism by which the dispersion-promoting materials act is not fully understood. Certain observations, however, indicate that the following mechanisms may apply to a greater or lesser extent, depending on the particular combination of dispersion-promoting material and dispersion imaging material employed.

In the case of a dispersion-promoting material comprising silver nitrate, the silver nitrate may dissociate under the effect of the applied light energy to form nuclei for the formation of the globules in the dispersion reaction.

Figure 10:
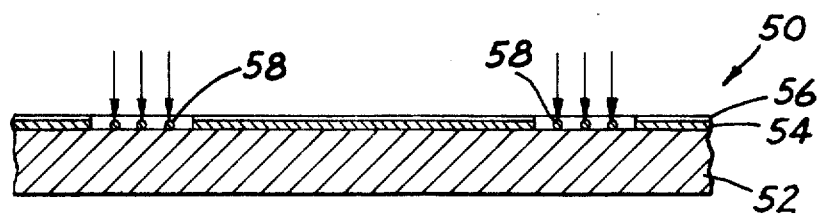
Figure 11:
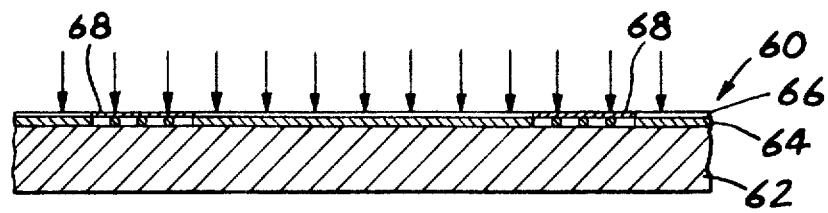

In the case of a dispersion-promoting material such as gum arabic, it has been found that the gum arabic must be on the free surface of the dispersion imaging material to produce its greatest activating effect. If it is provided at the interface between the substrate and the film of the dispersion imaging material, it is much less effective. The gum arabic provided on the surface of the dispersion imaging material may have a pronounced effect on the surface tension of the molten or softened dispersion imaging material. It may also, as in the case of silver nitrate, provide nuclei for the formation of the individual globules or other structures formed in the dispersion process. Because gum arabic forms a tenacious layer, adhering to the dispersion imaging material, it may also act to promote the breaking up of the film of the dispersion imaging material into small segments or particles, followed by softening or melting of the individual particles formed in this manner to form the globules or other particles in the course of dispersion. In any event, as shown in FIG. 10, the layer 56 of dispersion-promoting material, at the areas thereof subjected to energy, breaks down, and portions at least of the dispersion-promoting material are incorporated in the globules 58 formed by the dispersion imaging material.

It should be clear from the foregoing that any material which exerts one or more of the stated effects or similar effects aiding in the dispersion and in the formation of the globular or other particles of the dispersion imaging material can be used as a dispersion-promoter. While gum arabic and silver nitrate, are especially effective for this purpose, exemplary of other materials which can be used as dispersion promoters are gum tragacanth, sodium carboxymethylcellulose, sodium alginate, sodium caseinate, silver iodate, and the like.

Hereinbefore, the imaging method of the invention has been described as employing a separate imaging mask or master. It has been found that the method operates as efficiently when the mask is made an integral part of the structure to be imaged. The mask, referred to herein as an indigenous mask, may be provided on the film of dispersion imaging material or on the reverse side of the substrate if the latter is transparent or translucent or otherwise energy transmissive. Of course, it may also be provided on any coatings which are contained on the film or layer of the dispersion imaging material.

The indigenous mask may be provided in a variety of ways. Thus, for example, it may be produced by e.g. typing with dark carbon paper or ink onto the film of a lighter colored dispersion imaging material. In this case, the dark areas produced by the typing absorb upon exposure to radiant energy more energy so that the dispersion imaging material underlying these darker typed areas disperses to form a negative of the typed image. In a similar manner one may use a dark colored dispersion imaging material for typing a light colored ink or a light colored duplicating sheet which gives off a light colored or less absorptive material. In this case, a positive of the typed image is obtained upon exposure because the dark background absorbs more energy and disperses, leaving the lighter colored typed areas undispersed. Any other method such as writing, drawing, or other mechanical means may be used to produce the indigenous mask on the film of the dispersion imaging material or on the reverse side of the substrate, as the case may be.

In accordance with a preferred practice of the invention, the indigenous mask is produced by photographic means by providing a photosensitive layer on the film of dispersion imaging material or on the reverse side of the substrate. In this embodiment of the method of the invention the photosensitive layer is exposed to lower, or normal, levels of illumination which do not in themselves disperse the dispersion imaging materials, but which are capable of producing the indigenous mask. Thereafter, the structure is subjected to higher levels of energy as described before.

The photosensitive materials useful in providing an indigenous mask on the imaging structures can be selected from a wide group. In fact, any photosensitive material which forms, upon exposure to normal illumination levels, selected areas which differ in their absorption characteristics from those of the unexposed material may be used to provide an indigenous mask on the film of dispersion imaging material or on the reverse side of the substrate. Upon subsequent exposure to energy of the imaged structure containing the indigenous mask, the final image is formed as described above by virtue of the fact that the darker, more absorbant areas, and the lighter less absorbant areas, differentially absorb the energy to effect dispersion of the dispersion imaging material. Depending on whether the background is lighter or darker than the areas of the indigenous mask, a negative or positive image is obtained. Of course, when making the higher energy level exposure which causes the dispersion of the dispersion imaging material, intensity of the energy and the time of exposure is selected such that the more absorptive areas receive energy in an amount which causes dispersion, while the lesser absorptive areas receive energy in an amount below the dispersion threshold so that preferably no dispersion takes place in the areas of lesser absorption. While light energy is the preferred means of forming the indigenous mask, any other suitable method may be used. It is apparent from the foregoing that the imaging technique using the indigenous mask preferably employs whole format flashing rather than scanning or similar methods, though the latter are possible.

Representative embodiments of structures useful in providing indigenous masks in accordance with this aspect of the invention are illustrated in FIGS. 11 through 15. The structure 60 shown in FIG. 11 comprises a substrate 62 having a continuous film 64 of a dispersion imaging material provided thereon. On the outer surface of the film 64 there is provided a layer 66 of photosensitive material. The indigenous mask formed in the layer 66 by exposure through a mask to visible light, for example, is represented by areas 68—68. Upon exposure of the structure 60 to higher levels of energy, as described hereinabove and as indicated by the arrows, the areas 68—68 act to absorb a greater amount of energy resulting in dispersion of the film 64 under the areas 68—68.

Figure 12:
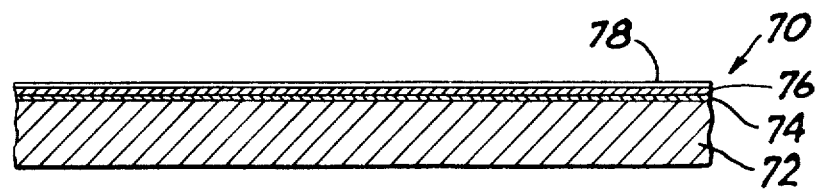
Figure 13:
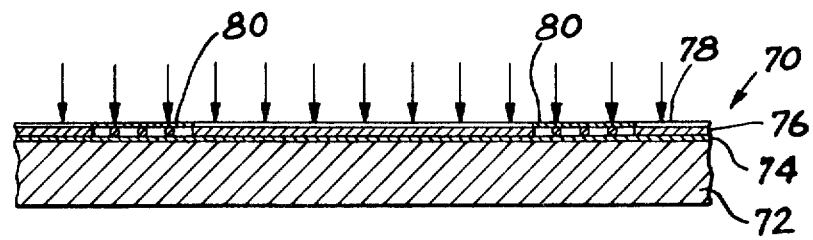

In FIGS. 12 and 13, there is illustrated a structure 70 having uniquely sensitive properties for the purposes of the present invention. As shown, the structure 70 comprises a substrate 72 having formed thereon a layer or film 74 of a low-wettability material such as aluminum oxide. The layer or film 74 may be applied to the substrate 72 in the manner described in connection with the structure 40 illustrated in FIG. 9. The outer surface of the layer 74 is provided with a continuous film 76 of a dispersion imaging material, bismuth in particular. The film 76, in turn, is provided with a coating or layer 78 of a photosensitive material, more specifically, arsenic trisulfide. As described above, an indigenous mask is formed in the layer 78 by exposing the layer 78 to visible light through a silver halide master, for example. The exposed areas 80—80 are thus converted to a state which renders them more absorbant with respect to the energy employed to disperse the material of the film 76. As a result, dispersion takes place in those portions of the film 76 which underlie the exposed areas 80—80 of the photosensitive layer 78. The non-wettable layer 74, as in the case of the structure 40 shown in FIG. 9, accelerates and facilitates the dispersion process. The sensitivity of the structure 70 is of the order of ten times greater than that of the structure 16, for example, shown in FIGS. 1 through 5 of the drawings.

Figure 14:
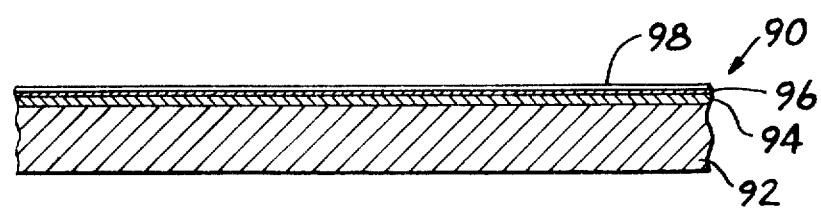
Figure 15:
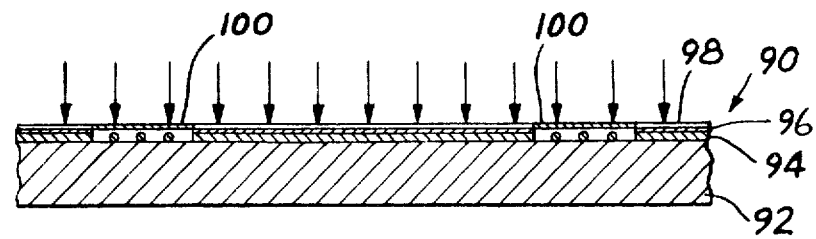

In FIGS. 14 and 15, the structure 90 illustrated comprises a substrate 92 having a film 94 of a dispersion imaging material, such as tellurium, adhered thereto. The film 94 is provided with a thin layer 96 comprised of a reflective material such as elemental silver. Overlying the silver layer 96 is a coating or layer 98 of a photosensitive material such as arsenic trisulfide. An indigenous mask is formed, as described above, in the layer 98, and is represented in FIG. 15 by the areas 100—100. The change in state which the layer 98 undergoes upon exposure to light gives rise to a chemical reaction between the silver of the layer 96 and the material comprising the layer 98 which acts to bind the silver underlying the exposed areas 100—100 of the layer 98 in the layer 98. Upon exposure of the structure 90 to energy sufficient to disperse the film 94, the silver underlying the unexposed portions of the photosensitive 98 acts to reflect the energy while the exposed areas 100—100 act to absorb the energy. As a result dispersion of the film 94 occurs in the regions thereof underlying the areas 100—100. The photosensitive layer 98, together with the remainder of the silver layer 96, can thereafter be removed and the silver recovered.

As stated above, the photosensitive materials useful in the formation of an indigenous mask can be selected from a wide group. Included in this group are photosensitive inorganic compounds such as the aforementioned arsenic trisulfide; alkali metal halides exemplified by lithium fluoride, cesium fluoride and barium iodide; silver halides and emulsions thereof comprising silver bromide, silver iodide and silver chloride; thallium halide emulsions; organo-metallic compounds exemplified by the ferric salts of organic acids such as oxalic, citric and tartaric acids; dichromated gelatin and starch; and the like. Among the many organic photosensitive materials which can be used are dye coupled aromatic diazo and azo compounds; diazoquinone compounds; organic azido compounds; halogenated resins capable of degradation upon exposure to light such as vinyl chloride and vinylidene chloride; and the like.

Many of the photosensitive materials useful in the practice of the invention are available commercially. Specific examples of such products are the vesicular diazo material sold under the trademark "KALVAR" (Kalvar), and the so-called "Dry Silver" product sold by 3M Company.

The images produced by the method of the invention have wide applications. If the substrate is transparent or translucent, the images may serve as projectable transparencies. Because of their excellent resolution and sharpness and definition they may also be used to advantage for producing microrecords. If the substrate is reflective, the images may serve for recording and duplicating purposes of all kinds. The dispersion imaging materials may be contained on a reflective surface such as one of glossy paper.

The new dispersion method of the invention may be used with particular benefit for recording the output of a computer. Since no development or fixing is required, the computer records produced in this manner are available immediately for further use and evaluation.

If the semiconductor dispersion imaging materials are used in this or other applications with a laser supplying the radiant energy for the dispersion, smaller lasers may be used.

By suitable choice of the substrate and dispersion imaging material, the image may serve directly as a lithographic printing plate, such as in the case where the substrate is hydrophilic and the dispersion imaging material is oleophilic or vice versa. No wet treatment is necessary for producing the offset lithographic printing plates in accordance with the present invention. It is to be noted that the dispersed phase of an oleophilic dispersion imaging material, because of the very small particle size, does not print and clean whites are obtained in spite of the fact that the oleophilic finely dispersed material is present in the hydrophilic areas. If an oleophilic substrate and an oleophilic dispersion imaging material is used, it is often possible to render, preferably after imaging by the method of the invention, the undispersed areas of the oleophilic dispersion imaging material hydrophilic, for instance, by a brief treatment in suitable salt solutions such as in aqueous solutions of silver nitrate, stannous chloride or of various soluble nickel salts, to produce a lithographic plate of excellent quality.

If desired, a thin metal layer may be employed between the layer of dispersion imaging material and the substrate, whereby the metal may be etched away in the dispersed areas of the image by a subsequent conventional etching step, with or without subsequent removal of the undispersed dispersion imaging material, to produce deep etch lithographic offset printing plates, printed circuits, arrays of electrical components produced in situ and the like.

By suitable choice of the substrate, and of the dispersion imaging material, and depending on the presence or absence of intermediary layers the image may be adapted to any desired use and purpose.

The images obtained by the method of the invention may be directly viewed or viewed with the aid of suitable reflectance or transmission readers. The images may also be read by detection equipment using optical, electrical or other physical principles in their operation. Any of the known detection methods may be used for reading out of the images.

The invention will be further illustrated by the following examples, parts being by weight.

EXAMPLE I

A one-half micron thick film of tellurium is deposited by sputtering techniques on a 5 mil thick Mylar film.

Onto the tellurium film is placed a chromium mask containing a microrecord representation and the tellurium film is subjected through the mask to a ½ millisecond flash of a Honeywell 700 electronic flash unit, held at a distance of one inch from the film plane.

A positive transparency copy of the microrecord, having excellent resolution and definition is obtained.

EXAMPLE II

A one-half micron thick film of tellurium is deposited by the vacuum deposition technique on a 5 mil thick cellulose acetate film.

The metal mask of Example I is placed onto the tellurium film, and the film is exposed through the mask to a 10 millisecond flash of a GE No. 5 clear flash bulb placed at a distance of one-half inch.

A positive transparency copy of the microrecord, having excellent resolution and definition, is obtained.

The experiment is repeated, however, applying by dipping a thin coating of gum arabic onto the tellurium film. After drying, the film is exposed as before. Dispersion of the tellurium and formation of the copy of the microrecord could be achieved at a distance of the flash bulb of about one inch.

In another experiment, the film of tellurium is dipped into a dilute aqueous solution of gum arabic and silver nitrate. After drying, the film is exposed as before. Dispersion of the tellurium and formation of an excellent copy of the microrecord could be achieved at a distance of the flash bulb of about 2 inches. When a master consisting of a silver halide emulsion on cellulose acetate is used, dispersion of the treated tellurium could be readily achieved without damage to the silver halide mask.

EXAMPLE III

A one micron thick film of tellurium is deposited by vacuum deposition technique onto a 5 mil thick film of cellulose acetate.

A mask of a silver halide emulsion on a cellulose acetate substrate representing a microfilm master and containing letter representations is placed in close contact with the tellurium layer. The beam of a pulsed Argon laser of 100 milliwatts, Tru Model 83A is focused on the image plane and the master is serially scanned with the pulsed laser at 4 microsecond pulse width to produce a copy of the master on the tellurium layer.

Evaluation of the master indicated that there is no damage to the silver halide mask.

EXAMPLE IV

The foregoing Examples I and II are repeated, however, substituting for the tellurium the following materials:

a. A dispersion imaging composition consisting of 83 atomic parts tellurium, 13 atomic parts germanium, 2 atomic parts antimony and 2 atomic parts sulfur.
b. A dispersion imaging composition consisting of 50 atomic parts tellurium and 50 atomic parts sulfur.
c. A dispersion imaging composition consisting of 95 atomic parts tellurium and 5 atomic parts germanium.
d. A dispersion imaging composition consisting of 95 atomic parts selenium and 5 atomic parts tellurium.
e. A dispersion imaging composition consisting of 95 atomic parts selenium and 5 atomic parts sulfur.
f. A dispersion imaging material consisting of antimony trisulfide.
g. A dispersion imaging material consisting of bismuth.
h. A dispersion imaging composition consisting of 95 atomic parts tellurium and 5 atomic copper.
i. A dispersion imaging composition consisting of 95 atomic parts tellurium and 5 atomic parts tin.
j. A dispersion imaging material consisting of selenium.
k. A dispersion imaging composition consisting of 30 atomic parts arsenic, 30 atomic parts sulfur and 40 atomic parts tellurium.
l. A dispersion imaging material consisting of lead.

The films of these materials are flashed through a mask by a Honeywell 700 electronic flash gun. The distance of the flash gun from the film plane is varied between ⅛ inch and 1 inch. The pulse width is in all instances ½ millisecond. The film thickness is varied between 0.2 micron and one micron.

In all cases, dispersion of the dispersion imaging material is achieved with the formation of images of excellent definition and sharpness.

EXAMPLE V

A 150 Angstrom thick film of aluminum oxide is formed on a 5 mil thick film of Mylar by evaporating aluminum metal onto the Mylar film in the presence of oxygen. A ½ micron thick continuous film of tellurium is then deposited by vacuum deposition on the aluminum oxide layer. A chromium mask of the type used in Example I is placed onto the tellurium film and is subjected to a ⅓ millisecond flash of a Honeywell 700 electronic flash unit held at a distance of 1 inch from the tellurium film plane. A positive transparency copy of the microrecord, having excellent resolution and definition is obtained.

EXAMPLE VI

A 1200 Angstroms thick film of tellurium is deposited, by sputtering, on a 5 mil thick Mylar film. A light sensitive layer ½ micron thick is formed on the tellurium film by applying to it a solution comprising a mixture of 50 milligrams of 3,6-tetramethyldiamino-9-(p-dimethylaminophenyl) xanthene and 100 milligrams of 2-mercapto-benzothiazole in 3 cc of acetane. An image is made on the light sensitive layer by exposing it for 3 seconds through a silver microfilm negative in a 500-watt slide projector at a distance of 45 inches. The exposure produces an intense red print out image in the exposed areas against a nearly colorless background in the unexposed areas. The imaged layer is then subjected to a 1/10 millisecond flash of a GE No. 5 clear flash bulb placed at a distance of 1 inch. The light sensitive layer is removed to provide a transparency copy of the silver microfilm negative having excellent resolution and definition.

EXAMPLE VII

A 200 Angstrom thick film of aluminum oxide is applied to a 5 mil thick Mylar substrate by sputtering aluminum metal thereon in an atmosphere of reduced oxygen content. Onto the aluminum oxide film, a 1000 Angstroms thick film of bismuth is deposited by vacuum deposition. A 0.2 micron thick layer of arsenic trisulfide is then formed on the film of bismuth. The layer of arsenic trisulfide is exposed through a silver halide microfilm mask for ½ second using a Microscan A-9 exposure unit. The entire layer of arsenic trisulfide is then subjected to a one millisecond flash of a GE No. 5 clear flash bulb placed at a distance of ½ inch. A negative transparency of the microrecord having excellent resolution and definition is obtained.

EXAMPLE VIII

A 0.2 micron thick film of tellurium is vacuum deposited onto a 5 mil thick film of polyethylene. A 300 Angstroms thick layer of a photosensitive material comprising silver bromide sold under the designation "Dry Silver" by 3M Company is then formed on the tellurium film. The structure is exposed as set forth in Example VI to provide a transparency having excellent resolution and definition. The photosensitive layer can be removed, and the silver recovered.

We claim:

1. The method of producing an image which comprises the steps of providing a solid continuous film of dispersion imaging material on a substrate, wherein the wettability of the substrate by said dispersion imaging material when it is in fluid state, has a certain value, providing between said continuous film of dispersion imaging material and said substrate a layer of another material which is capable of reducing the wettability of the substrate by said fluid dispersion imaging material substantially below said certain value, and selectively applying to at least one selected discrete area of said continuous film of dispersion imaging material an amount of high intensity radiant energy for a length of time sufficient to cause the material of the continuous film in those areas which have been subjected to said energy to change to a fluid state in which the surface tension of the material and the decreased wettability act to cause the material to change to a discontinuous film comprising spaced apart sepaglobules about which light can pass to provide a stable finished image of said discontinuous film in the continuous film corresponding to the pattern of the selected area and the non-selected area.

2. A method according to claim 1 wherein the wettability reducing material is aluminum oxide.

3. The method of claim 1 in which the solid continuous film of dispersion imaging material is a composition comprising tellurium.

4. The method of claim 1 in which the solid continuous film of dispersion imaging material is tellurium.

5. The method of claim 1 in which the high intensity radiant energy is provided by a laser beam.

6. The method of claim 1 in which the substrate comprises a transparent organic material.

7. The method of producing an image which comprises the steps of providing on a substrate a solid continuous film of a dispersion imaging material which, upon application of high intensity radiant energy in an amount sufficient to increase the absorbed energy in the material above a certain threshold value, is capable of changing to a substantially molten state in which the surface tension of the material acts to cause the continuous film where subject to said energy to change to a discontinuous film comprising spaced apart separate globules about which light can pass, providing on said continuous film of dispersion imaging material a layer of another material which has the capacity of promoting said change in state of said dispersion imaging material, and selectively applying to at least one selected area of said continuous film of dispersion imaging material and said other material thereon high intensity radiant energy in an amount and for a length of time sufficient to cause the material of the continuous film in those areas which have been subjected to said energy to change to a substantially molten state for causing the continuous film thereat to change to the discontinuous film comprising the spaced apart separate globules about which light can pass to provide a stable finished image of said discontinuous film in the continuous film corresponding to the pattern of the selected areas and the non-selected areas.

8. The method of claim 7, in which the solid continuous film of a dispersion imaging material is a composition comprising tellurium.

9. The method of claim 7, in which the solid continuous film of a dispersion imaging material is tellurium.

10. The method of claim 7, in which the said layer of said another material comprises gum arabic.

11. The method of claim 7, in which the said layer of said another material comprises a mixture of gum arabic and silver nitrate.

12. The method of claim 7 in which the high intensity radiant energy is provided by a laser beam.

13. The method of claim 7 in which the substrate comprises a transparent organic material.

* * * * *